United States Patent
Saito et al.

(10) Patent No.: US 8,227,834 B2
(45) Date of Patent: Jul. 24, 2012

(54) SEMICONDUCTOR DEVICE

(75) Inventors: Yasunobu Saito, Tokyo (JP); Wataru Saito, Kanagawa-ken (JP); Yorito Kakiuchi, Kanagawa-ken (JP); Tomohiro Nitta, Kanagawa-ken (JP); Akira Yoshioka, Kanagawa-ken (JP); Tetsuya Ohno, Kanagawa-ken (JP); Hidetoshi Fujimoto, Kanagawa-ken (JP); Takao Noda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/218,925

(22) Filed: Aug. 26, 2011

(65) Prior Publication Data

US 2011/0309413 A1      Dec. 22, 2011

Related U.S. Application Data

(62) Division of application No. 12/371,216, filed on Feb. 13, 2009, now Pat. No. 8,030,660.

(30) Foreign Application Priority Data

Feb. 13, 2008 (JP) .................................. 2008-032187
Dec. 24, 2008 (JP) .................................. 2008-327004

(51) Int. Cl.
*H01L 29/80* (2006.01)
(52) U.S. Cl. ........ 257/192; 257/193; 257/194; 257/199; 257/E29.31; 257/E29.327
(58) Field of Classification Search .......... 257/192–194, 257/199, E29.31, E29.327
See application file for complete search history.

(56) References Cited

U.S. PATENT DOCUMENTS

| | | |
|---|---|---|
| 2007/0254431 A1 | 11/2007 | Saito et al. |
| 2007/0295993 A1 | 12/2007 | Chen et al. |
| 2008/0023706 A1 | 1/2008 | Saito et al. |
| 2008/0116486 A1 | 5/2008 | Saito et al. |
| 2008/0277692 A1 | 11/2008 | Saito et al. |

FOREIGN PATENT DOCUMENTS

| | | |
|---|---|---|
| JP | 2005-244072 | 9/2005 |
| JP | 2006-032650 | 2/2006 |
| JP | 2007-294528 | 11/2007 |

OTHER PUBLICATIONS

Y. Cai, et al.; "High-Performance-Enhancement-Mode AlGaN/GaN HEMTs Using Flouride-Based Plasma Treatment"; IEEE Electron Device Letters, vol. 26, No. 7, pp. 435-437, 2005.

*Primary Examiner* — Cuong Q Nguyen
*Assistant Examiner* — Tran Tran
(74) *Attorney, Agent, or Firm* — Patterson & Sheridan, LLP

(57) ABSTRACT

A semiconductor device includes: a first semiconductor layer including $Al_XGa_{1-X}N$ ($0 \leqq X \leqq 1$); a second semiconductor layer provided on the first semiconductor layer, including $Al_YGa_{1-Y}N$ ($0 \leqq Y \leqq 1$, $X < Y$), and having a larger bandgap than the first semiconductor layer; a source electrode provided on the second semiconductor layer; a drain electrode provided on the second semiconductor layer; and a gate electrode provided on the second semiconductor layer between the source electrode and the drain electrode. A region of the second semiconductor layer below the gate electrode at a depth short of the first semiconductor layer is doped with atoms to be negatively charged in the second semiconductor layer.

9 Claims, 5 Drawing Sheets

SEMICONDUCTOR DEVICE

CROSS-REFERENCE TO RELATED APPLICATIONS

This application is a divisional of U.S. patent application Ser. No. 12/371,216, filed Feb. 13, 2009 which is based upon and claims the benefit of priority from the prior Japanese Patent Application No. 2008-032187, milked on Feb. 13, 2008 and the prior Japanese Patent Application No. 2008-327004, filed on Dec. 24, 2008; the entire contents of which are incorporated herein by reference.

BACKGROUND OF THE INVENTION

1. Field of the Invention

This invention relates to a semiconductor device, and more particularly to a semiconductor device based on a heterojunction structure of nitride semiconductors.

2. Background Art

Circuits like switching power supplies and inverters are based on power semiconductor devices such as switching devices and diodes, and the power semiconductor devices are required to have high breakdown voltage and low on-resistance. Between the breakdown voltage and the on-resistance, there is a tradeoff depending on the device material. By using nitride semiconductors such as GaN and AlGaN or wide bandgap semiconductors such as silicon carbide (SiC) as a device material, the tradeoff depending on the material can be improved relative to silicon to achieve low on-resistance and high breakdown voltage.

Devices based on nitride semiconductors such as GaN and AlGaN have good material characteristics, and hence high-performance power semiconductor devices can be realized. In particular, a HEMT (high electron mobility transistor) having an AlGaN/GaN heterostructure can realize low on-resistance because a high-concentration two-dimensional electron gas is generated by polarization at the interface between the AlGaN layer and the GaN layer.

However, in the HEMT, the generation of a high-concentration two-dimensional electron gas without impurity doping contrarily makes it difficult to realize a normally-off transistor. To achieve normally-off characteristics while maintaining low on-resistance, the two-dimensional electron gas concentration below the gate electrode needs to be selectively decreased.

To this end, for example, a recess gate structure is known (e.g., JP-A-2006-032650 (Kokai)), in which the AlGaN layer immediately below the gate electrode is etched to decrease the two-dimensional electron gas concentration only in the portion immediately below the gate electrode.

This recess etching is performed by dry etching such as reactive ion etching because AlGaN and GaN are chemically stable materials and difficult to wet etch. Here, the etching depth needs high accuracy in control and uniformity because the etching depth dictates the two-dimensional electron gas concentration. Furthermore, damage caused by dry etching is not negligible, which also causes concern about problems such as increased leakage current.

In a rectifying device (diode) based on nitride semiconductors, low on-resistance is compatible with high breakdown voltage. However, it is known that its leakage current at reverse bias is larger by several orders of magnitude than theoretically expected, which is a major problem for practical application.

SUMMARY OF THE INVENTION

According to an aspect of the invention, there is provided a semiconductor device including: a first semiconductor layer including $Al_XGa_{1-X}N$ ($0 \leq X \leq 1$); a second semiconductor layer provided on the first semiconductor layer, including $Al_YGa_{1-Y}N$ ($0 \leq Y \leq 1$, $X<Y$), and having a larger bandgap than the first semiconductor layer; a source electrode provided on the second semiconductor layer; a drain electrode provided on the second semiconductor layer; and a gate electrode provided on the second semiconductor layer between the source electrode and the drain electrode, a region of the second semiconductor layer below the gate electrode at a depth short of the first semiconductor layer being doped with atoms to be negatively charged in the second semiconductor layer.

According to another aspect of the invention, there is provided a semiconductor device including: a first semiconductor layer including $Al_XGa_{1-X}N$ ($0 \leq X \leq 1$); a second semiconductor layer provided on the first semiconductor layer, including $Al_YGa_{1-Y}N$ ($0 \leq Y \leq 1$, $X<Y$), and having a larger bandgap than the first semiconductor layer; an anode electrode provided on the second semiconductor layer; and a cathode electrode provided on the second semiconductor layer, a region of the second semiconductor layer below the anode electrode at a depth short of the first semiconductor layer being doped with chlorine atoms.

DETAILED DESCRIPTION OF THE INVENTION

First Embodiment

Figure 1:
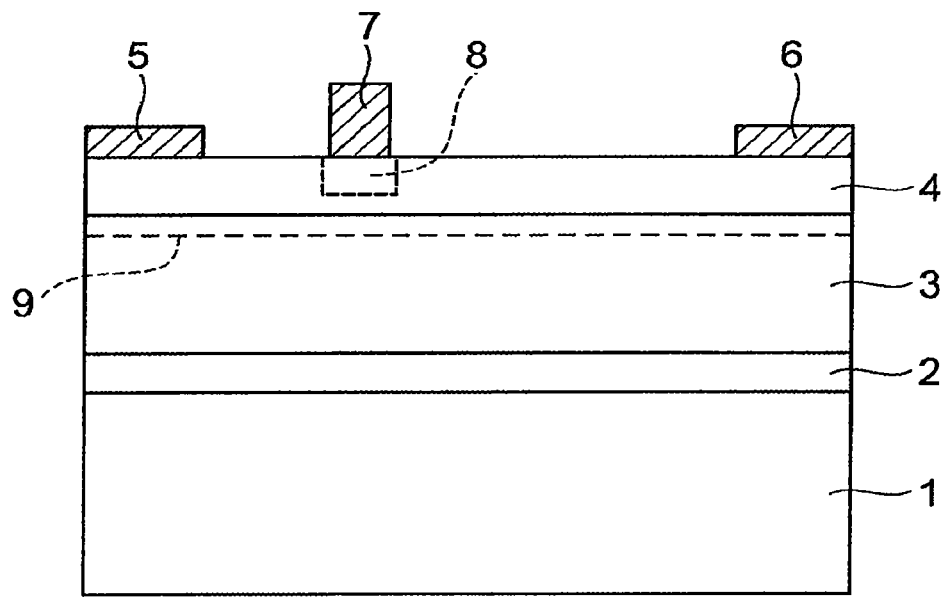
FIG. 1 is a schematic view showing a cross section of the relevant part of a semiconductor device according to a first embodiment of the invention.

FIG. 1 is a schematic view showing a cross section of the relevant part of a semiconductor device according to an embodiment of the invention. This embodiment is described with a GaN-based HEMT (high electron mobility transistor) taken as an example of the semiconductor device.

The semiconductor device according to this embodiment includes a heterojunction structure of a first semiconductor layer (channel layer) 3 provided via a buffer layer 2 on a support substrate 1, and a second semiconductor layer (barrier layer) 4 having a larger bandgap than the first semiconductor layer 3. The buffer layer 2, the first semiconductor layer 3, and the second semiconductor layer 4 are epitaxially grown in this order on the support substrate 1.

The first semiconductor layer 3 includes undoped $Al_XGa_{1-X}N$ ($0 \leq X \leq 1$), which is not intentionally doped and does not substantially contain impurities, and the second semiconductor layer 4 includes undoped or n-type $Al_YGa_{1-Y}N$ ($0 \leq Y \leq 1$, $X<Y$). In this embodiment, for example, the first semiconductor layer 3 is an undoped GaN layer, and the second semiconductor layer 4 is an undoped or n-type AlGaN layer.

The support substrate 1 and the buffer layer 2 are made of materials suitable for epitaxial growth of GaN-based materials. The support substrate 1 can be illustratively made of sapphire, SiC, Si, or GaN. The buffer layer 2 can be illustratively made of AlN or AlGaN.

A source electrode 5 and a drain electrode 6 are spaced from each other on the surface of the second semiconductor layer 4. The source electrode 5 and the drain electrode 6 are each in ohmic contact with the surface of the second semiconductor layer 4. A gate electrode 7 is provided on the second semiconductor layer 4 between the source electrode 5 and the drain electrode 6. The gate electrode 7 is in Schottky contact with the surface of the second semiconductor layer 4.

In the heterojunction structure with the first semiconductor layer 3 illustratively made of GaN and the second semiconductor layer 4 illustratively made of AlGaN, AlGaN has a smaller lattice constant than GaN. Hence, a strain occurs in the AlGaN layer, and the piezoelectric effect causes piezoelectric polarization in the AlGaN layer. Thus, a two-dimensional electron gas 9 is formed in the GaN layer near the interface with the AlGaN layer. By controlling the gate voltage applied to the gate electrode 7, the two-dimensional electron gas concentration below the gate electrode 7 is varied, and the main current flowing between the source electrode 5 and the drain electrode 6 can be controlled.

In particular, a semiconductor device used for power control is desired to have normally-off characteristics, in which no substantial leakage current flows between the drain electrode and the source electrode at a gate voltage of zero volts. When the two-dimensional electron gas concentration is decreased, the gate threshold voltage is shifted to the plus side, realizing normally-off characteristics. However, the decrease in the concentration of the overall two-dimensional electron gas results in increased on-resistance. To achieve normally-off characteristics while maintaining low on-resistance, the two-dimensional electron gas concentration below the gate electrode needs to be selectively decreased.

To this end, in this embodiment, a region of the second semiconductor layer 4 below the gate electrode 7 to a depth short of the first semiconductor layer 3 is doped with atoms to be negatively charged in the second semiconductor layer 4. The region doped with these atoms is shown as a doped region 8 in FIG. 1. The dopant atoms are implanted into the second semiconductor layer 4 illustratively by ion implantation.

The dopant atom has a property of being negatively charged in the second semiconductor layer 4 including $Al_YGa_{1-Y}N$ ($0 \leq Y \leq 1$, $X<Y$), and can illustratively be a halogen atom.

The aforementioned dopant atom serves as a negative fixed charge in the second semiconductor layer 4 below the gate electrode 7, and prevents the generation or reduces the concentration of the two-dimensional electron gas below the gate electrode 7. That is, by the amount of negative fixed charge below the gate electrode 7, the gate threshold for passing a drain current is shifted to the plus side, achieving normally-off operation.

The aforementioned dopant atom is arbitrary as long as it is negatively charged in the second semiconductor layer 4 including $Al_YGa_{1-Y}N$ ($0 \leq Y \leq 1$, $X<Y$) (e.g., AlGaN layer). However, in particular, a halogen atom having high electronegativity easily becomes an anion when implanted into the second semiconductor layer 4, and a high threshold shift effect can be expected. Among others, fluorine (electronegativity 3.98) and chlorine (electronegativity 3.16) have particularly high electronegativity, and hence a higher threshold shift effect can be expected.

If the atoms implanted from the frontside of the second semiconductor layer 4 reach the first semiconductor layer 3 and deeply penetrate into the position of the channel (two-dimensional electron gas 9), the implanted atoms interfere with the motion of electrons and decrease the mobility of the two-dimensional electron gas. This causes characteristics degradation such as increased on-resistance. Hence, ion implantation needs to be performed on the condition that the implanted atoms are confined in the second semiconductor layer 4 and do not reach the depth of the two-dimensional electron gas 9.

Figure 2:
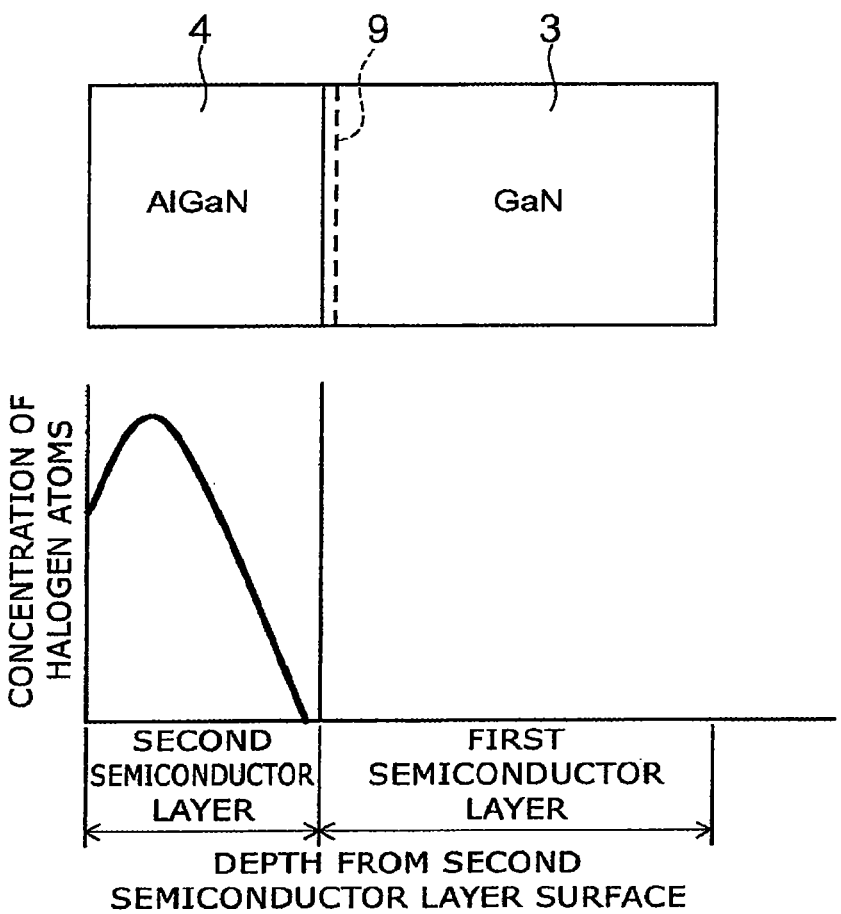
FIG. 2 is a schematic view showing the depthwise distribution from the frontside of the second semiconductor layer of halogen atoms implanted into the second semiconductor layer in the first embodiment.

The graph in FIG. 2 shows an example of the depthwise concentration distribution of atoms (e.g., halogen atoms) implanted from the frontside of the second semiconductor layer 4 in this embodiment. In the graph, the horizontal axis represents the depth from the frontside of the second semiconductor layer 4, and the vertical axis represents the concentration of implanted halogen atoms. FIG. 2 also shows the position of the second semiconductor layer 4, the first semiconductor layer 3, and the two-dimensional electron gas 9 corresponding to the horizontal axis of the graph.

For example, by controlling the acceleration voltage of atoms during ion implantation, the distribution of implanted atoms can be confined in the second semiconductor layer 4. Thus, normally-off operation can be achieved without degrading characteristics for a transistor.

Halogen atoms are introduced into the second semiconductor layer 4 by ion implantation. Hence, the concentration distribution thereof in the second semiconductor layer 4 has a peak at the implantation position and is sloped therearound along the thickness. In the example shown in FIG. 2, the concentration peak (implantation position) of halogen atoms in the second semiconductor layer 4 is located nearer to the frontside of the second semiconductor layer 4 than the interface with the first semiconductor layer 3. The concentration gradually decreases from the peak position toward the frontside and the first semiconductor layer 3 side.

The fluorine atom is lighter than the chlorine atom, and hence its implantation position is relatively difficult to control to a shallow depth so as not to reach the first semiconductor layer 3. In contrast, the chlorine atom is nearly twice as heavy as the fluorine atom, and hence has good controllability in ion implantation to a shallow depth so as to be confined in the second semiconductor layer 4.

After ion implantation, heat treatment (typically above 400° C. for fluorine and chlorine) is needed to activate implanted atoms and recover from damage during ion implantation. In this embodiment, heat treatment at 500° C., for example, is performed after ion implantation.

Figure 3:
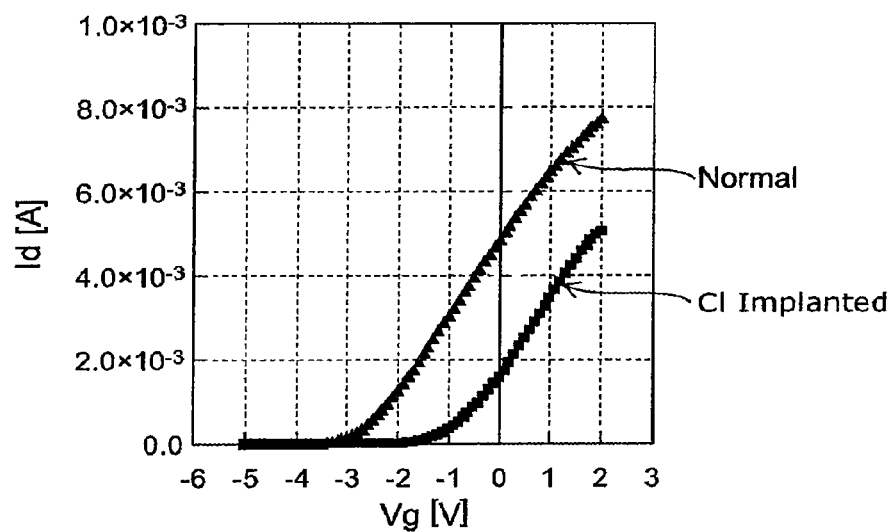
FIG. 3 shows gate voltage (Vg) versus drain current (Id) characteristics, comparing between a normal HEMT having an AlGaN/GaN heterostructure (Normal structure) and the same HEMT except that chlorine atoms are ion implanted into the AlGaN layer below the gate electrode (Cl implanted structure)

FIG. 3 shows gate voltage (Vg) versus drain current (Id) characteristics, comparing between a HEMT having an AlGaN/GaN heterostructure with a gate length of 20 μm (Normal structure) and the same HEMT except that chlorine atoms are ion implanted into the AlGaN layer below the gate electrode to a depth short of the GaN layer and heat treated at 500° C. (Cl implanted structure).

In the Cl implanted structure, the amount of implanted chlorine atoms is insufficient and results in a small amount of shift to the plus side in the gate voltage threshold. Thus, normally-off operation, in which the drain current Id is to vanish at a gate voltage of zero volts, is not achieved. However, it is seen that by using the structure according to this embodiment, threshold shift of the gate voltage to the plus side is realized in contrast to the Normal structure.

Figure 4:
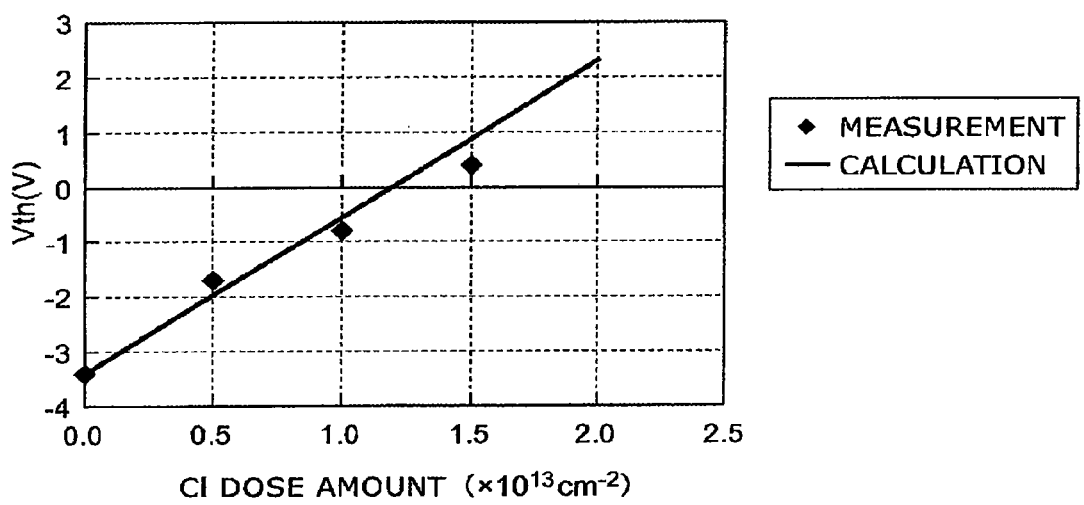
FIG. 4 shows the relationship between the dose amount of chlorine atoms into the AlGaN layer (horizontal axis) and the threshold Vth of the gate voltage (vertical axis) in the HEMT having an AlGaN/GaN heterostructure.

FIG. 4 shows the relationship between the dose amount of chlorine atoms into the AlGaN layer (horizontal axis) and the threshold Vth of the gate voltage (vertical axis). In the figure, the point indicated by a diamond represents the measured threshold of the device in which chlorine atoms are actually implanted into the AlGaN layer, and the solid line represents the calculated value assuming that the chlorine atom implanted into the AlGaN layer acts as a monovalent anion.

From the result of FIG. 4, the measurement is in relatively good agreement with the calculation, and it is seen that the threshold of the gate voltage can be controlled by controlling the dose amount of atoms to serve as negative fixed charges in the second semiconductor layer 4.

Here, it is also contemplated to use a mask to selectively apply plasma treatment with a CF-based gas to the surface of the AlGaN layer below the gate electrode. Thus, the AlGaN layer below the gate electrode may be doped with fluorine atoms to be negatively charged in the AlGaN layer. The effect of such negative fixed charges may decrease the two-dimensional electron gas concentration only in the portion below the gate electrode to realize a normally-off structure.

However, plasma treatment may cause poor reproducibility due to the so-called loading effect, in which the plasma density varies with the opening area and pattern of the mask and the number of wafers. This causes concern about problems in terms of productivity.

In contrast, according to this embodiment, selective introduction of impurities for normally-off operation can be realized by a method established in the silicon semiconductor process, that is, combination of ion implantation and heat treatment. Hence, a normally-off nitride semiconductor device with good uniformity and reproducibility can be manufactured.

If magnesium (Mg), for example, is ion implanted as an atom to be negatively charged in the AlGaN layer, a temperature above 1000° C. is needed for activation heat treatment after ion implantation. Here, there is concern that this heat treatment may deteriorate the crystallinity of the epitaxial growth layer, for example, and degrade such characteristics as sheet resistance. Furthermore, the activation ratio of Mg is as low as approximately 10%, which requires implantation at high concentration. This increases ion implantation damage, and the characteristics degradation resulting therefrom also causes concern.

In contrast, for fluorine and chlorine, the temperature for heat treatment after ion implantation can be as low as approximately 400 to 500° C. This serves to avoid crystallinity deterioration and the like which may lead to characteristics degradation.

With regard to the region doped with atoms to be negatively charged in the second semiconductor layer 4, at least the region immediately below the gate electrode 7 needs to be doped for normally-off operation. Furthermore, to control the two-dimensional electron gas concentration for other purposes, a region other than immediately below the gate electrode 7 may be doped with atoms to be negatively charged in the second semiconductor layer 4.

Second Embodiment

Figure 5:
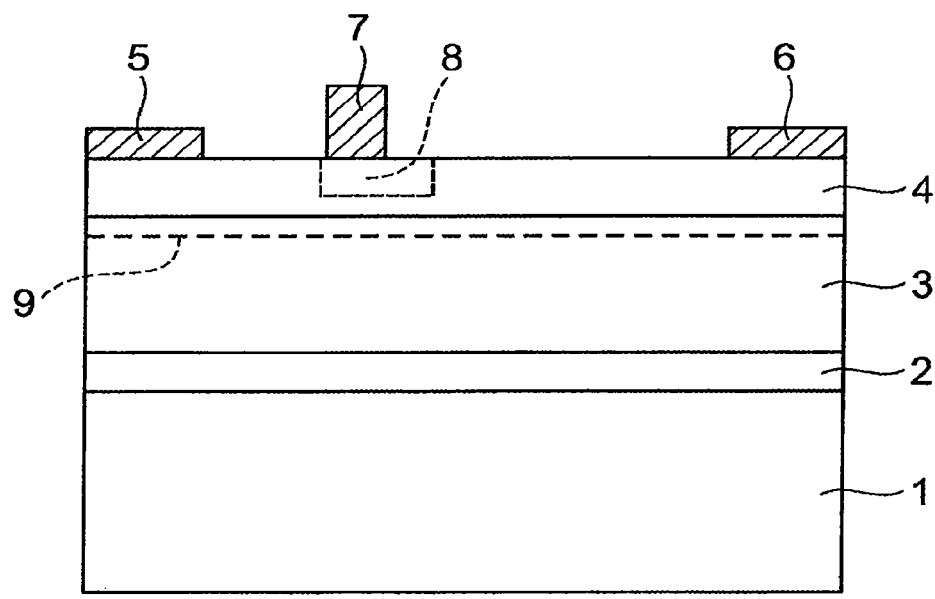
FIG. 5 is a schematic view showing a cross section of the relevant part of a semiconductor device according to a second embodiment of the invention.

In a second embodiment shown in FIG. 5, for example, a region near the gate electrode 7 in the second semiconductor layer 4 between the gate electrode 7 and the drain electrode 6 is also selectively doped with atoms to be negatively charged in the second semiconductor layer 4, such as aforementioned halogen atoms.

Thus, the two-dimensional electron gas concentration is reduced around the end portion of the gate electrode 7 on the drain electrode 6 side to alleviate the electric field concentrating on the gate electrode edge. Hence, avalanche breakdown at this portion can be prevented to increase the breakdown voltage.

Furthermore, to alleviate electric field concentration to further increase the breakdown voltage, preferably, the two-dimensional electron gas concentration around the end portion of the gate electrode 7 on the drain electrode 6 side has a concentration gradient that gradually increases from the gate electrode 7 side toward the drain electrode 6 side. To this end, preferably, the dose amount of atoms added into the second semiconductor layer 4 thereabove to serve as negative fixed charges is controlled to realize this concentration gradient.

Third Embodiment

Figure 6:
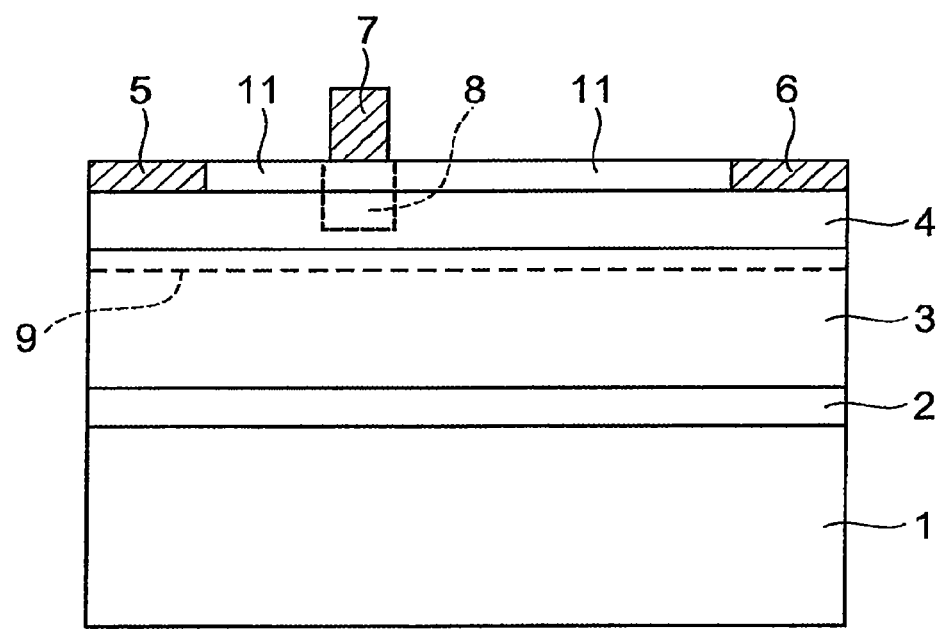
FIG. 6 is a schematic view showing a cross section of the relevant part of a semiconductor device according to a third embodiment of the invention.

Typically, the surface of AlGaN is often unstable. Hence, in the case where the second semiconductor layer 4 is made of AlGaN, a layer having more stable material or composition (e.g., undoped or n-type GaN layer) can be provided as a cap layer 11 on the second semiconductor layer 4 as shown in FIG. 6 to stabilize the device surface condition and reduce variations in characteristics.

Also in this structure, atoms to be negatively charged in the second semiconductor layer 4, such as aforementioned halogen atoms, can be implanted from the frontside of the cap layer 11 below the gate electrode 7 to a depth short of the first semiconductor layer 3 so that the negative fixed charges are confined in the second semiconductor layer 4. Thus, normally-off operation can be achieved without degrading characteristics for a transistor. The negative fixed charge only needs not to reach the first semiconductor layer 3 serving as a channel layer in which the two-dimensional electron gas 9 is formed, and causes no problem even if it is located in the cap layer 11.

In the above embodiments, a GaN-based HEMT is taken as an example of the semiconductor device based on nitride semiconductors. The following embodiments are described with a rectifying device (diode) taken as an example.

In a diode based on nitride semiconductors, low on-resistance is compatible with high breakdown voltage. However, it is known that its leakage current at reverse bias is larger by several orders of magnitude than theoretically expected, which is a major problem for practical application.

To solve this problem, there is a proposal of forming an anode electrode by combination of electrodes having a high Schottky barrier and a low Schottky barrier to achieve low on-resistance, low leakage current, and high breakdown voltage. Furthermore, there is another proposal of introducing fluorine below the anode electrode.

However, the configuration of an anode electrode based on two materials having different Schottky barriers has a problem of increased manufacturing cost.

In the method of fluorine doping below the anode electrode, because the fluorine atom is relatively light, fluorine is likely to penetrate deeply into the semiconductor layer. This causes concern that the fluorine atoms reach the two-dimensional electron gas and interfere with its migration, leading to increased ionic resistance. For this problem, penetration of fluorine atoms into a deep position can be reduced by ion implantation at low acceleration voltage or plasma doping of fluorine. However, ion implantation at low acceleration voltage requires a special apparatus different from a commonly-used ion implantation apparatus. Furthermore, plasma doping may cause poor reproducibility and other problems due to the so-called loading effect, in which the plasma density varies with wafer size, pattern density, and the number of processed wafers. Hence, the above methods have trouble with cost and productivity.

Thus, in the following embodiments, chlorine atoms are introduced into the barrier layer below the anode electrode by ion implantation.

Fourth Embodiment

Figure 7:
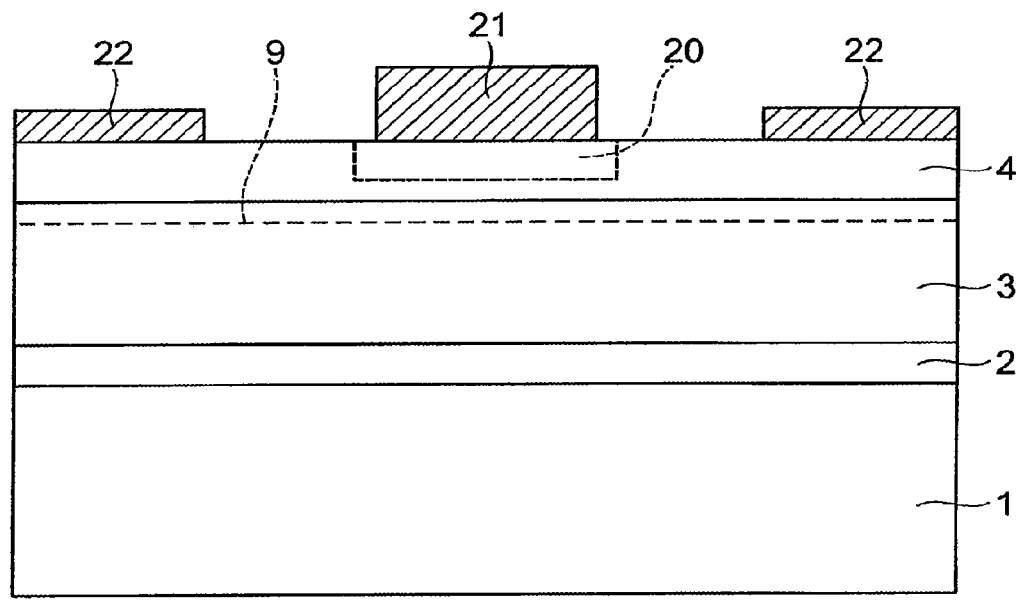
FIG. 7 is a schematic view showing a cross section of the relevant part of a semiconductor device according to a fourth embodiment of the invention.

FIG. 7 is a schematic view showing a cross section of the relevant part of a semiconductor device according to a fourth embodiment of the invention.

The semiconductor device according to this embodiment includes a heterojunction structure of a first semiconductor layer (channel layer) 3 provided via a buffer layer 2 on a support substrate 1, and a second semiconductor layer (barrier layer) 4 having a larger bandgap than the first semiconductor layer 3. The buffer layer 2, the first semiconductor layer 3, and the second semiconductor layer 4 are epitaxially grown in this order on the support substrate 1.

The first semiconductor layer 3 includes undoped $Al_XGa_{1-X}N$ ($0 \leq X \leq 1$), and the second semiconductor layer 4 includes undoped or n-type $Al_YGa_{1-Y}N$ ($0 \leq Y \leq 1$, $X<Y$). In this embodiment, for example, the first semiconductor layer 3 is an undoped GaN layer, and the second semiconductor layer 4 is an undoped or n-type AlGaN layer.

The support substrate 1 and the buffer layer 2 are made of materials suitable for epitaxial growth of GaN-based materials. The support substrate 1 can be illustratively made of sapphire, SiC, Si, or GaN. The buffer layer 2 can be illustratively made of AlN or AlGaN.

An anode electrode 21 and a cathode electrode 22 are spaced from each other on the surface of the second semiconductor layer 4. The cathode electrode 22 is formed in a pattern surrounding the anode electrode 21 on the surface of the second semiconductor layer 4. The anode electrode 21 is in Schottky contact with the surface of the second semiconductor layer 4. The cathode electrode 22 is in ohmic contact with the surface of the second semiconductor layer 4.

In the heterojunction structure with the first semiconductor layer 3 illustratively made of GaN and the second semiconductor layer 4 illustratively made of AlGaN, AlGaN has a smaller lattice constant than GaN. Hence, a strain occurs in the AlGaN layer, and the piezoelectric effect causes piezoelectric polarization in the AlGaN layer. Thus, a two-dimensional electron gas 9 is formed in the GaN layer near the interface with the AlGaN layer.

During application of forward voltage in which the anode electrode 21 is placed at a higher potential than the cathode electrode 22, a forward current flows between the anode electrode 21 and the cathode electrode 22 through the two-dimensional electron gas 9.

In this embodiment, a region of the second semiconductor layer 4 below the anode electrode 21 to a depth short of the first semiconductor layer 3 is doped with chlorine atoms. The region doped with chlorine atoms is shown as a chlorine-doped region 20 in FIG. 7. The dopant atoms are implanted into the second semiconductor layer 4 by ion implantation and diffused into the second semiconductor layer 4 by heat treatment.

The aforementioned chlorine atom serves as a negative fixed charge in the second semiconductor layer 4 below the anode electrode 21, and reduces the two-dimensional electron gas concentration below the anode electrode 21. This can reduce reverse current (leakage current) during application of reverse voltage in which the anode electrode 21 is placed at a lower potential than the cathode electrode 22. Chlorine has relatively high electronegativity, and easily becomes an anion when implanted into the second semiconductor layer 4. Thus, a significant effect of reducing leakage current is achieved.

If the chlorine atoms implanted from the frontside of the second semiconductor layer 4 reach the first semiconductor layer 3 and deeply penetrate into the position of the channel (two-dimensional electron gas 9), the implanted chlorine atoms interfere with the motion of electrons and decrease the mobility of the two-dimensional electron gas. This causes characteristics degradation such as increased on-resistance. Hence, ion implantation needs to be performed on the condition that the implanted atoms is confined in the second semiconductor layer 4 and do not reach the depth of the two-dimensional electron gas 9.

Figure 8:
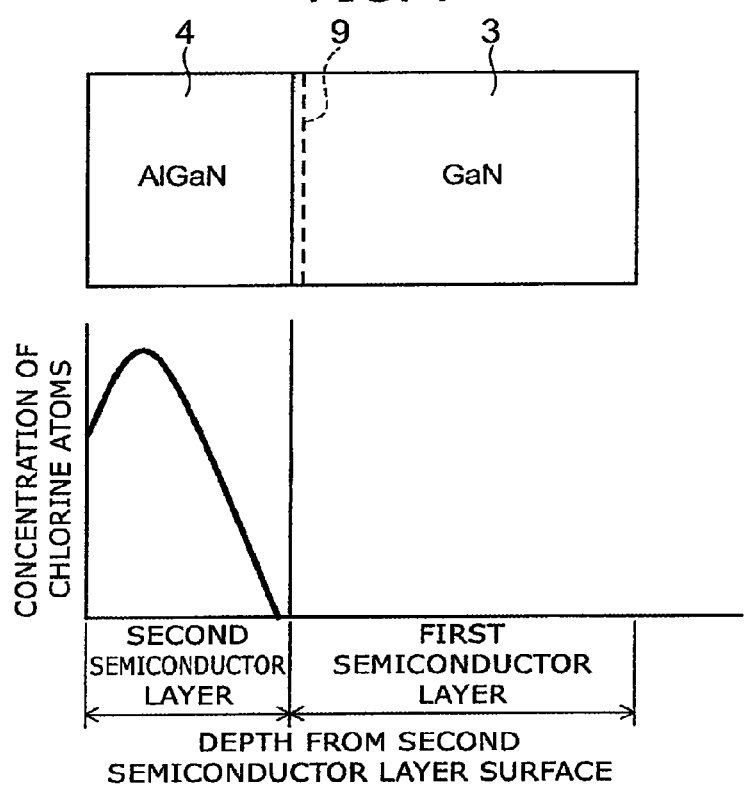
FIG. 8 is a schematic view showing the depthwise distribution from the frontside of the second semiconductor layer of chlorine atoms implanted into the second semiconductor layer in the fourth embodiment.

The graph in FIG. 8 shows an example of the depthwise concentration distribution of chlorine atoms implanted from the frontside of the second semiconductor layer 4 in this embodiment. In the graph, the horizontal axis represents the depth from the frontside of the second semiconductor layer 4, and the vertical axis represents the concentration of implanted chlorine atoms. FIG. 8 also shows the position of the second semiconductor layer 4, the first semiconductor layer 3, and the two-dimensional electron gas 9 corresponding to the horizontal axis of the graph.

The chlorine atom is nearly twice as heavy as the fluorine atom, for example, and hence has good controllability in ion implantation to a shallow depth so as to be confined in the second semiconductor layer 4 without reaching the two-dimensional electron gas 9.

Chlorine is introduced into the second semiconductor layer 4 by ion implantation. Hence, the chlorine concentration distribution in the second semiconductor layer 4 has a peak at the implantation position and is sloped therearound along the thickness. In the example shown in FIG. 8, the concentration peak (implantation position) of chlorine atoms in the second semiconductor layer 4 is located nearer to the frontside of the second semiconductor layer 4 than the interface with the first semiconductor layer 3. The concentration gradually decreases from the peak position toward the frontside and the first semiconductor layer 3 side.

After ion implantation, heat treatment is performed to activate implanted chlorine atoms and recover from damage during ion implantation. For chlorine, the temperature for heat treatment after ion implantation can be as low as approximately 400 to 500° C. This serves to avoid crystallinity deterioration and the like which may lead to characteristics degradation.

Figure 9:
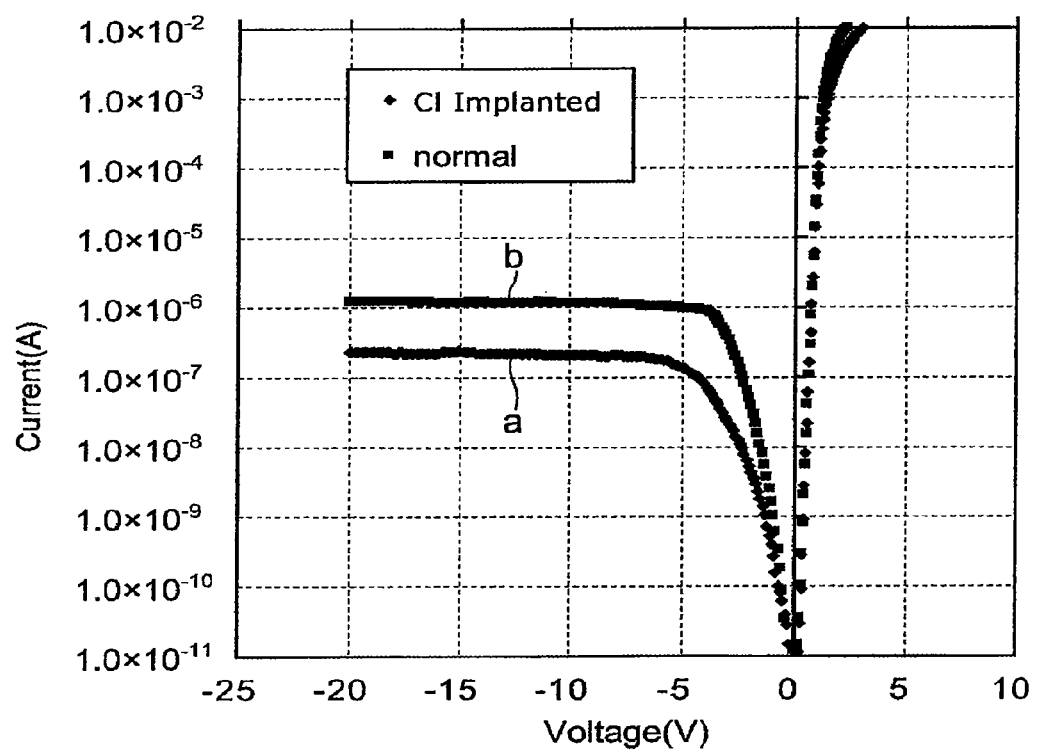
FIG. 9 shows voltage versus current characteristics, comparing between the case where chlorine atoms are implanted into the AlGaN layer below the anode electrode and the case without implantation.

In FIG. 9, graph a (Cl implanted) shows an example of voltage-current characteristics in the case where chlorine atoms are ion implanted into the AlGaN layer below the anode electrode to a depth short of the GaN layer and heat treated at 500° C. as described above. Graph b (normal) is an example of characteristics in the case without chlorine implantation.

The result of FIG. 9 shows that chlorine implantation below the anode electrode achieves a lower reverse current (leakage current) than the case without it.

As described above, this embodiment can reduce leakage current, which causes trouble in diodes based on nitride semiconductors. Hence, this embodiment can provide a diode with low on-resistance, low leakage current, and high breakdown voltage.

Furthermore, chlorine is introduced into the second semiconductor layer 4 by a method established in the silicon semiconductor process, that is, combination of ion implantation and heat treatment. Hence, a diode with good uniformity and reproducibility in characteristics can be provided. That is, there is no problem of the aforementioned loading effect in plasma doping. Furthermore, use of chlorine provides good controllability in implantation depth. Chlorine does not reach the two-dimensional electron gas and interfere with electron migration.

Fifth Embodiment

Figure 10:
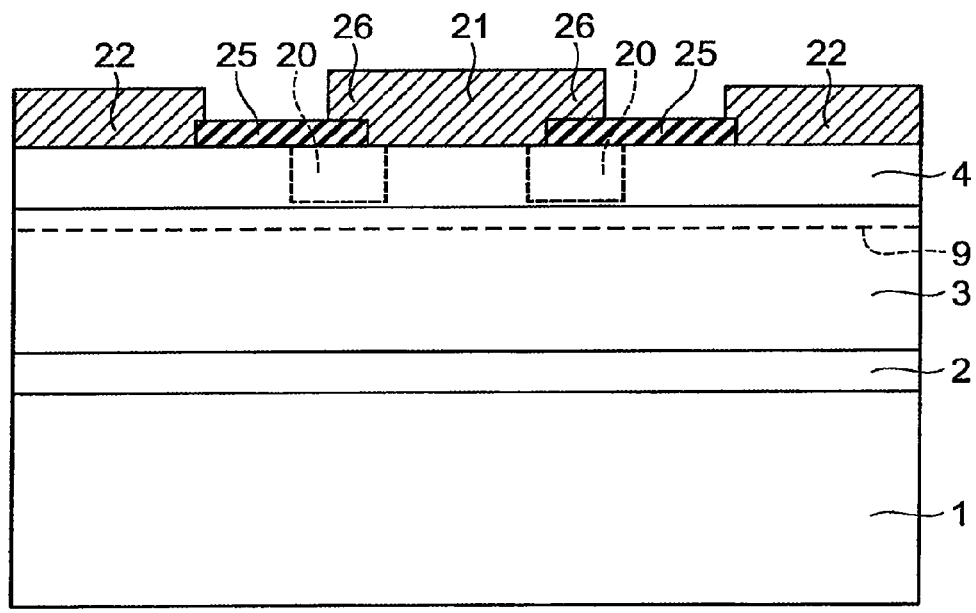
FIG. 10 is a schematic view showing a cross section of the relevant part of a semiconductor device according to a fifth embodiment of the invention.

FIG. 10 is a schematic view showing a cross section of the relevant part of a semiconductor device according to a fifth embodiment of the invention.

In this embodiment, chlorine is introduced only around the end portion of the anode electrode 21 on the cathode electrode 22 side to form a chlorine-doped region 20. Also in this embodiment, the chlorine-doped region 20 is confined in the second semiconductor layer 4 without reaching the first semiconductor layer 3.

Around the end portion of the anode electrode 21 on the cathode electrode 22 side, the electric field strength tends to increase, and leakage current is likely to occur particularly in that portion. Hence, a significant effect of reducing leakage current can be achieved by introducing chlorine only in that portion to reduce the two-dimensional electron gas concentration, that is, to increase resistance. Furthermore, because the resistance of the portion below the anode electrode 21 between the chlorine-doped regions 20 is not increased, the on-resistance during forward bias can be reduced.

A dielectric film 25 serving as a protective film is provided on the surface of the second semiconductor layer 4 between the anode electrode 21 and the cathode electrode 22, and part of the anode electrode 21 extends on the dielectric film 25 to the cathode electrode 22 side to serve as a field plate electrode 26. This prevents lines of electric force from locally concentrating on the end portion of the anode electrode 21. Thus, avalanche breakdown at that portion is prevented to achieve high breakdown voltage.

The field plate electrode 26 is not limited to the structure integrated with the anode electrode 21, but may be separately provided. In either case, the field plate electrode 26 only needs to be equipotential to the anode electrode 21.

The dielectric film 25 can be illustratively made of SiN, $SiO_2$, $Al_2O_3$, $HfO_2$, $TaO_x$, $TiO_2$, or any combination of at least two of them (e.g., a combination of SiN and $SiO_2$).

Also in the fourth and fifth embodiment, like the third embodiment shown in FIG. 6, a layer having more stable material or composition (e.g., undoped or n-type GaN layer) than AlGaN may be provided as a cap layer on the second semiconductor layer 4 to stabilize the device surface condition and reduce variations in characteristics.

The embodiments of the invention have been described with reference to examples. However, the invention is not limited thereto, but can be variously modified within the spirit of the invention.

In the above embodiments, the combination of the second semiconductor layer (barrier layer) and the first semiconductor layer (channel layer) is illustrated by the combination of AlGaN/GaN. However, the invention is also applicable to the combination of GaN/InGaN and the combination of AlN/AlGaN.

The gate structure in the first to third embodiment is not limited to the Schottky gate structure, but may be the MIS (metal-insulator-semiconductor) gate structure or the recess gate structure. Furthermore, a structure including a field plate electrode on the second semiconductor layer to increase the breakdown voltage, for example, can also achieve the effects like those described above, and the invention can be also practiced with this structure.

The invention claimed is:

1. A semiconductor device comprising:
   a first semiconductor layer including $Al_XGa_{1-X}N$ ($0 \leq X \leq 1$);
   a second semiconductor layer provided on the first semiconductor layer, including $Al_YGa_{1-Y}N$ ($0 \leq Y \leq 1$, $X<Y$), and having a larger bandgap than the first semiconductor layer;
   an anode electrode provided on the second semiconductor layer; and
   a cathode electrode provided on the second semiconductor layer,
   a region of the second semiconductor layer below the anode electrode at a depth short of the first semiconductor layer being doped with chlorine atoms.

2. The semiconductor device according to claim 1, wherein the region doped with the chlorine atoms is provided only around an end portion of the anode electrode on the cathode electrode side.

3. The semiconductor device according to claim 1, further comprising:
   a dielectric film provided on the second semiconductor layer between the anode electrode and the cathode electrode; and
   a field plate electrode provided on the dielectric film and set to be equipotential to the anode electrode.

4. The semiconductor device according to claim 1, wherein the anode electrode is in Schottky contact with the second semiconductor layer, and the cathode electrode is in ohmic contact with the second semiconductor layer.

5. The semiconductor device according to claim 1, wherein the first semiconductor layer is an undoped layer which is not substantially doped with impurities.

6. The semiconductor device according to claim 1, wherein the chlorine atom is atoms are introduced into the second semiconductor layer by ion implantation.

7. The semiconductor device according to claim 1, wherein concentration of the chlorine atoms in the second semiconductor layer is sloped along film thickness.

8. The semiconductor device according to claim 1, wherein the chlorine atoms have a concentration peak in the second semiconductor layer.

9. The semiconductor device according to claim 8, wherein the concentration peak of the chlorine atoms is located nearer to the surface of the second semiconductor layer than to the interface between the first semiconductor layer and the second semiconductor layer.

* * * * *